United States Patent
Washburn et al.

(10) Patent No.: US 7,260,000 B2
(45) Date of Patent: Aug. 21, 2007

(54) CONTROL SIGNAL INTERFACE CIRCUIT FOR COMPUTER MEMORY MODULES

(75) Inventors: Robert D. Washburn, Malibu, CA (US); Robert F. McClanahan, Valencia, CA (US)

(73) Assignee: Thunder Creative Technologies, Inc., Malibu, CA (US)

( * ) Notice: Subject to any disclaimer, the term of this patent is extended or adjusted under 35 U.S.C. 154(b) by 0 days.

(21) Appl. No.: 11/420,454

(22) Filed: May 25, 2006

(65) Prior Publication Data

US 2006/0280004 A1   Dec. 14, 2006

Related U.S. Application Data

(60) Provisional application No. 60/684,879, filed on May 25, 2005.

(51) Int. Cl.
*G11C 7/00* (2006.01)
(52) U.S. Cl. .................. 365/189.05; 365/230.06; 365/225.06
(58) Field of Classification Search ........... 365/230.06, 365/189.05, 225.6
See application file for complete search history.

(56) References Cited

U.S. PATENT DOCUMENTS

| | | | | |
|---|---|---|---|---|
| 5,262,984 A | * | 11/1993 | Noguchi et al. | 365/185.03 |
| 6,292,405 B1 | * | 9/2001 | Nicosia et al. | 365/189.05 |
| 6,314,037 B1 | * | 11/2001 | Shiomi et al. | 365/203 |

* cited by examiner

*Primary Examiner*—Huan Hoang
(74) *Attorney, Agent, or Firm*—J. D. Harriman, II; DLA Piper US LLP

(57) ABSTRACT

The invention is an electronic circuit designed for incorporation on computer memory modules such as DDR DIMMs. It couples control signals such as address bits, bank selects, enable and even clock signals between the module input connector and the memory devices. The circuit provides low propagation delay, fast rise and fall times with no overshoot or undershoot, and significantly improves timing control compared to memory modules of the present art. Capacitive loading on the motherboard is typically much less than that provided by a single memory device input and is independent of the number of memory devices per bank or the number of banks of memory devices on the memory module. For multiple memory modules connected to the memory bus, capacitive loading is essentially N times the equivalent loading for a single memory module.

7 Claims, 3 Drawing Sheets

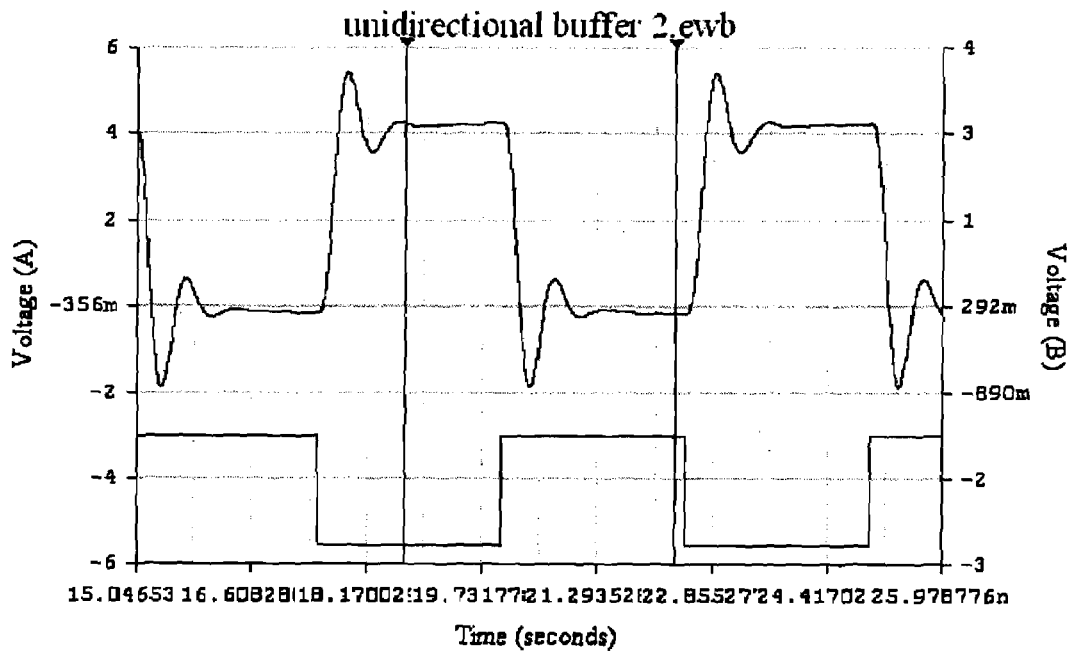
Figure 1: Typical Input and Output Waveforms for High Speed Buffer Interface Circuits (Not Used in DIMMs of the Present Art).
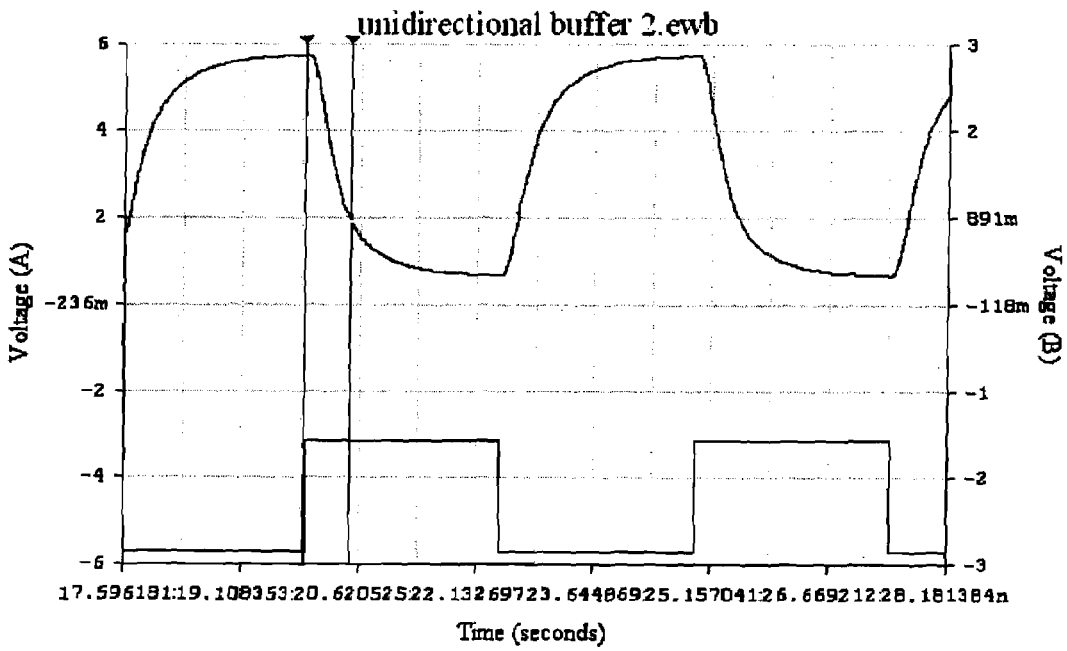
Figure 2: Typical Input and Output Waveforms for Control Signal Interface Circuit of the Present Invention.

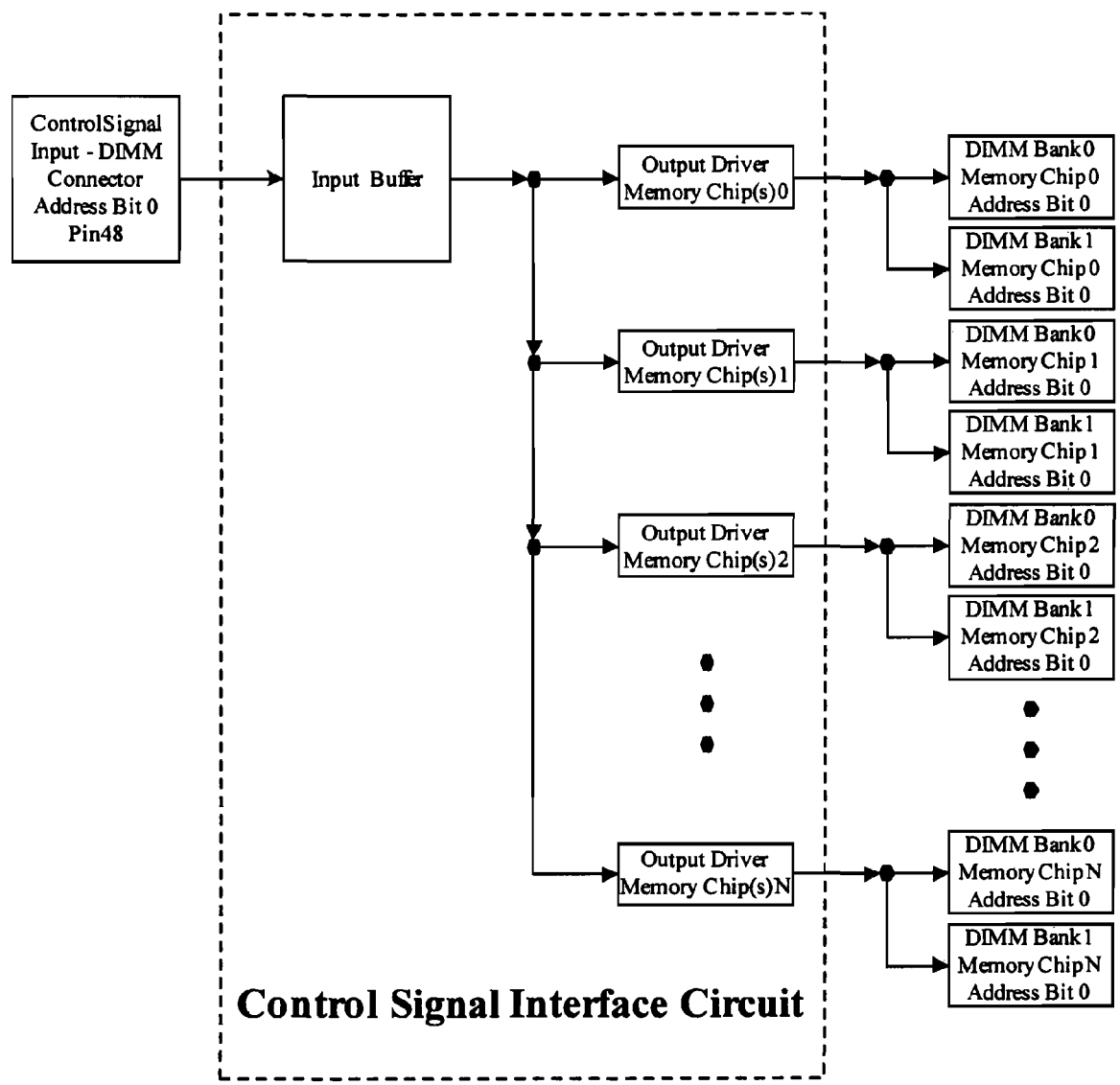
Figure 3: Control Signal Interface Circuit For Computer Memory Modules

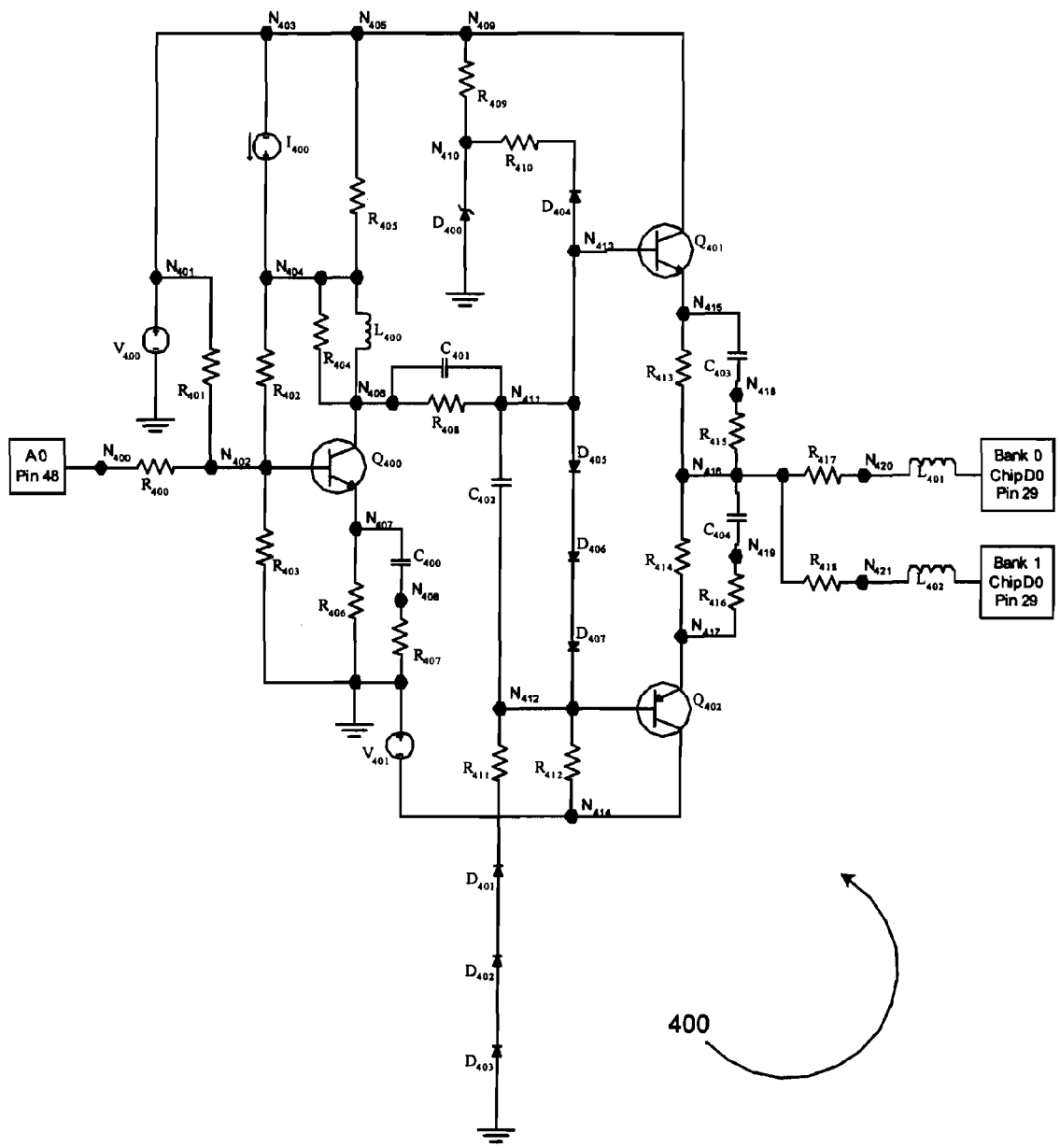
Figure 4: Control Signal Interface Circuit For Computer Memory Modules

CONTROL SIGNAL INTERFACE CIRCUIT FOR COMPUTER MEMORY MODULES

CROSS-REFERENCE TO RELATED APPLICATIONS

This patent application claims priority to provisional patent application 60/684,879 filed on May 25, 2005, which is herein incorporated by reference in its entirety.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

This invention relates to the field of control signal interface circuits with improved rise and fall time and low capacitive loading.

Since the development of the personal computer, the characteristics and performance of the main memory has played a major role in defining the capabilities of the computers. From the beginning, the trend in the state of the art has been toward larger, faster main memory that is simultaneously consistent with the trend to ever-lower computer prices. One aspect of main memory is the need for a control signal for use with the memory.

In the present art, a typical control signal is coupled through a series resistor (22 ohms) to one or more memory devices (e.g. eight or nine memory devices) through transmission line structures (typically having a characteristic impedance of, for example, 60-65 ohms). The form of memory device interconnection frequently depends on the location of the input signal pin on the DIMM, with daisy-chain connections very common. At best, the present art loads the input control signal with the equivalent input capacitance of each of the memory devices input pins (typically 3-5 pf each) in parallel. The total capacitance has made it extremely difficult to achieve fast memory speeds. In fact, the control-signal rise and fall times are typically greater than the entire clock period, forcing increased latency and effectively limiting memory access speeds.

It may be observed that where memory clock speeds were once comparable to processor clock speeds, at present they are only about one tenth of that of the processor without even considering the impact of latency. As a result, it would be desirable to have a memory interface circuit which simultaneously provides for fast rise and fall times, consistent faster timing, low capacitive loading on the motherboard, the ability to add multiple banks of memory devices without increasing capacitive loading, and the ability to parallel multiple memory modules on the memory bus without significantly impacting performance.

SUMMARY

The invention is an electronic interface circuit that is located on the memory module and transmits a control signal from the input connector to the memory devices in one or more banks of the devices. The circuit provides very low and nearly constant capacitive loading of the signal that is independent of the number of memory devices and number of banks of memory devices on the module. Multiple DIMMs can be connected to the memory bus without significant loading of the control signals. The invention provides for substantially faster control signal rise and fall times with no overshoot or undershoot, low signal propagation delay, with predictable and substantially reduced control signal timing ranges. The invention can also be used to distribute the clock signal on the DIMM. It makes feasible driving all of the memory devices from a single clock input rather than the multiple inputs presently used.

BRIEF DESCRIPTION OF THE DRAWING

FIG. 1 is an illustration of an example of a prior art waveform rise and fall time.

FIG. 2 is an illustration of an example of waveform rise and fall time using the invention.

FIG. 3 is a block diagram illustrating an embodiment of an interface circuit of the invention applied to one address bit of a two bank DIMM.

FIG. 4 is a circuit diagram of an embodiment of a control signal interface circuit of the invention for implementing the interface circuit illustrated in FIG. 3.

DETAILED DESCRIPTION

The invention is a high speed, low input capacitance interface circuit. It is directed toward coupling unidirectional control signals from the input connector of a memory module to the appropriate pins of the memory devices on the module. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Discussion of the invention is directed by way of example toward application to 184-pin, 2.5 Volt (VDD)/2.5 Volt (VDDQ), Unbuffered, Non-ECC, Double Data Rate, Synchronous DRAM Dual In-Line Memory Modules (DDR SDRAM DIMMs), henceforth referred to as DIMMs. DIMMs are intended for use as main memory when installed in PCs and network servers. While the present discussion is directed toward 184-pin DIMM modules, the invention is not so limited and can be applicable to a wide variety of modular and non-modular memory configurations as well as many non-memory device interfaces.

The invention reduces the capacitive loading that a single memory bank DIMM module places on the unidirectional control signals received from the motherboard. In the present art, a typical control signal is coupled through a series resistor (22 ohms) to the memory devices (typically 8 or 9) through transmission line structures (typically 60-65 ohms). At best, the present art loads the input control signal with the equivalent input capacitance of each of the memory devices (typically 1.5-5 pf each) in parallel. The form of memory device interconnection frequently depends on the location of the input signal pin on the DIMM, with daisy-chain connections very common. The form of interconnection can significantly aggravate loading and timing problems. If a second memory bank is added to the DIMM, total capacitive loading is doubled. Since the impedance of the transmission line is unchanged, rise and fall times of the control signals will also double. Likewise, if the number of memory banks is increased from two to four, the rise and fall times will again double.

A potential problem with high-speed circuits is the tendency to have overshoot and undershoot as well as ringing on the output waveform. These are illustrated in FIG. 1, which shows the simulated performance of a typical high-speed buffer circuit. The comparable simulated waveform for one embodiment of the invention is shown in FIG. 2. Each figure includes both input and output waveforms. The circuit is driving the equivalent of one address bit on four memory devices (typically one device in each of four banks of memory devices).

It is well known that voltages applied to semiconductor devices may exceed the maximum dc voltage rating of the device for very short durations since the destructive breakdown processes do not have sufficient time to build up to a level at which physical damage occurs to the semiconductor. Memory devices used on DIMMs are no exception and are typically specified to allow 1.5 volt spikes for less than about 3 ns and for less than ⅓ of the clock period. Although the spikes will not damage the memory devices, overshoot cannot help but produce internal current flows and charge accumulations that differ from normal operation. The conditions are at best unspecified since the overshoot amplitude is unknown and uncontrolled, but are clearly not compatible with maximum device performance. It is known that many memory device types and DIMMs on which they are mounted exhibit enhanced performance at higher bias voltages (VDD). Many users are operating DIMMs at higher voltages than that specified for a 2.5V module. The preferred condition is no overshoot and is provided by the invention as illustrated in FIG. 2.

In addition to the DIMM address and control signals, the invention may be used to distribute the clock. The clock inputs are differential signals terminated on the DIMM in 120 ohms (for the 184 pin version to which this discussion is directed). The clock signal interface implemented with the invention may consist of a single input buffer with ground referenced input termination and generation of both the clock and inverse clock with out of phase output drivers, 2 interface circuits, or differential input version of the interface circuit. A major benefit to clock distribution using the invention is that all memory devices on the DIMM may be driven from a single input clock signal. Use of a single clock input removes motherboard generated clock skew, improving timing margin on the DIMM by 100 ps or more.

FIG. 3 shows a functional block diagram of one embodiment of the invention. The invention comprises an input buffer and output driver(s). In general, there is one input buffer per DIMM and one output driver for each memory device position (the corresponding memory devices in all banks are typically driven from a single driver as illustrated in FIG. 2 for a two bank memory system). For meeting specific performance levels, selection of a particular embodiment depends largely on the current capacity and frequency characteristics of the transistors.

The output drivers, particularly on multi-bank DIMMs, are required to drive a large number of memory device inputs. Although theoretically only a single output driver is required, use of multiple drivers may be used since the drivers for all unidirectional control signals for each memory device position can be incorporated into an integrated circuit located near the memory device position. This approach can be easier to implement on a DIMM module and may cost less than use of fewer, higher current devices.

A large number output drivers may stress the drive capability of the input buffer stage, it may lack adequate fanout capability. This can be easily overcome if a few intermediate (output driver type) stages are added to the input buffer circuit. Use of intermediate stages in the buffer has the added benefit of reducing its performance sensitivity to variations in the motherboard impedance characteristics. The intermediate stages should be packaged as part of the input buffer integrated circuit, typically located adjacent to the input pin on the DIMM connector. Regardless of the embodiment of the invention, adjustments to component values and bias points may be made to obtain optimized performance for individual memory device types and DIMM configurations.

The embodiment uses bipolar junction transistors (BJTs) and technology for both the input buffer and output drivers. For the input buffer, a BJT provides lower loading on the motherboard memory bus. For the output drivers, use of BJTs provides for a reduction in gain near the end of the signal transition time as the device approach either ground or bias voltage. This characteristic coupled with wave shaping functions built into the circuit topology can both prevent overshoot or undershoot and allow the circuit designer to control transition times to optimize performance. Achievement of this requires none of the BJT base-collector junctions be forward biased at any time.

FIG. 4 is a circuit diagram of a one embodiment of the invention. Transistor Q400 and associated base, emitter, and collector circuitry comprise the input buffer. Resistor R408 and Capacitor C401 couple the output signal from the input buffer to the output driver portion of the circuit. The output driver is a push-pull structure formed by transistors Q401 and Q402 and capable of high current delivery during signal transitions. The current is primarily delivered through capacitors C403 and C404, at least until transitioning output(s) have passed the threshold for the new logic level.

Filtering, wave shaping, and clamping play a role in achievement of the fast transition. In addition to the C403 and C404 circuits, R404, R405, R406, R407, R408, R413, R414, R417, R418, L400, L401, L402, C401, C402, and C403 are part of the wave shaping function. Of particular interest are inductors L401 and L402. Typical values for these are 8 nH (assuming a memory device with 2 nH of lead inductance and 5 pf of input cap). Adding 8 nH (10 nH total with lead inductance) provides a damped resonant type interaction with the input capacitance of the memory device that effectively cancels a portion of the input capacitive loading.

Another element of the invention involves I400, R404 and R405. Together, these devices simultaneously provide sufficient gain and current for high-speed pull-up and pull-down of Q400 collector (including adequate drive for the output driver) as well as stable biasing of the input buffer stage. Current source I400 implementation will depend on the detailed characteristics and requirements for an individual application.

The embodiment shown in FIG. 4 also includes clamping functions. Zener diode D400 generates a clamp reference voltage. Clamping is produced by diodes D401, D402, D403, and D404 along with resistors R410 and R411. Unlike typical clamp circuits that are designed to prevent overvoltage induced component failure, clamping in the invention contributes to preventing forward bias of transistor base-collector junctions. It also plays a role in balancing the volt-second product across inductor L400 and its reset within desired timing parameters.

Thus, a control signal interface circuit for computer memory modules has been described.

What is claimed:
1. A circuit comprising:
  a low loading input buffer coupled to a control signal input and providing a buffer output;

an output driver coupled to the buffer output and to an integrated circuit;

wherein the output driver comprises a gain circuit for providing high speed pull-up and pull down of the input buffer output, and a clamp circuit for preventing forward bias.

2. The circuit of claim 1 wherein the integrated circuit is a memory.

3. The circuit of claim 2 wherein the input buffer comprises bipolar transistor with associated gate, emitter, and collector circuitry.

4. The circuit of claim 3 wherein the output driver comprise is a push-pull structure.

5. The circuit of claim 4 wherein the push-pull structure comprises a pair of bipolar junction transistors.

6. The circuit of claim 5 wherein the buffer is coupled to the output driver via an RC circuit.

7. The circuit of claim 6 further including a plurality of output drivers coupled to the input buffer and each coupled to associated memory banks.

* * * * *